(12) United States Patent
Kim

(10) Patent No.: US 8,350,307 B2
(45) Date of Patent: Jan. 8, 2013

(54) SEMICONDUCTOR MEMORY DEVICE WITH POWER DECOUPLING CAPACITORS AND METHOD OF FABRICATION

(75) Inventor: Sunghoon Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 575 days.

(21) Appl. No.: 12/539,824

(22) Filed: Aug. 12, 2009

(65) Prior Publication Data

US 2010/0078696 A1  Apr. 1, 2010

(30) Foreign Application Priority Data

Sep. 30, 2008 (KR) .................. 10-2008-0096116

(51) Int. Cl.
*H01L 29/94* (2006.01)
*H01L 21/8242* (2006.01)
(52) U.S. Cl. . 257/296; 257/300; 257/311; 257/E27.086; 257/E29.345; 438/239; 438/396
(58) Field of Classification Search .................. 257/296, 257/300, 311, E27.086, E27.088, E29.345; 438/239, 396
See application file for complete search history.

(56) References Cited

U.S. PATENT DOCUMENTS

| 2003/0178659 | A1* | 9/2003 | Kato .............................. 257/296 |
| 2006/0208299 | A1 | 9/2006 | Yang |
| 2006/0289932 | A1* | 12/2006 | Ahn et al. ..................... 257/334 |
| 2007/0252217 | A1 | 11/2007 | Oki |
| 2009/0065837 | A1* | 3/2009 | Lee et al. ........................ 257/296 |

FOREIGN PATENT DOCUMENTS

| JP | 2001102526 A | 4/2001 |
| JP | 2006270101 A | 10/2006 |
| JP | 2007299860 A | 11/2007 |
| KR | 1020060101685 A | 9/2006 |

* cited by examiner

*Primary Examiner* — Minh-Loan T Tran
(74) *Attorney, Agent, or Firm* — Volentine & Whitt, PLLC

(57) ABSTRACT

Provided is a semiconductor memory device including a capacitor structure extending over core and peripheral areas of a substrate. Respective portions of the capacitor structure function as memory cell capacitors in the core area and as first and second capacitors in the peripheral area. A combination of the first and second capacitors functions as a first power decoupling capacitor, and a transistor disposed in the peripheral area functions as a second power decoupling capacitor.

15 Claims, 10 Drawing Sheets

(a)

(b)

(c)

SEMICONDUCTOR MEMORY DEVICE WITH POWER DECOUPLING CAPACITORS AND METHOD OF FABRICATION

CROSS-REFERENCE TO RELATED APPLICATION

This U.S. non-provisional patent application claims priority under 35 U.S.C §119 to Korean Patent Application No. 10-2008-0096116, filed on Sep. 30, 2008, the subject matter of which is hereby incorporated by reference.

BACKGROUND

The present invention relates to semiconductor memory devices and methods of fabrication. More particularly, the invention relates to semiconductor memory devices including a power decoupling capacitor and method of fabricating same.

Contemporary semiconductor memory devices are formed from a multiplicity of elements operatively arranged in various circuits. One common element regularly appearing in such circuits is the capacitor. Capacitors are commonly used in some types of memory devices to form memory cells capable of storing data. That is, a capacitor is used within each memory cell to store an amount of electrical charge indicative of a certain data value. For example, each memory cell in a dynamic random access memory (DRAM) includes a transistor and a capacitor. Charge is introduced or removed from the capacitor via the corresponding transistor to define a data state (i.e., a "1" or "0" data state for a single bit memory cell). Ideally, charge stored on a memory cell capacitor would be stably maintained for a long period of time. Accordingly, capacitors having relatively high capacitance are advantageous, since they better maintain charge over time.

Capacitors are used in many other circuits within semiconductor memory devices. In one type of circuit, a capacitor is used to dampen or cancel undesired signal reflections (or echoes) on a signal line. In another type of circuit, a capacitor is connected to a power terminal to buffer rapid fluctuation in a power supply voltage. That is, the capacitor acts as a low pass filter. When used in filter circuits, capacitors having a relatively high capacitance are advantageous since they better maintain charge.

The capacitance of a capacitor is highly correlated to its dielectric which is a material sandwiched between the two conductive surfaces (e.g., plates) forming the body of the capacitor. The capacitance of a capacitor is also proportional to the area of the conductive surfaces separated by the dielectric, and inversely proportional to a distance between the conductive surfaces. These physical relationships pose great challenges to circuit designers and fabrication specialists in the field of semiconductor memory devices, since shrinking device size reduces the size of most, if not all, constituent elements, including capacitors. Reduced capacitor size leads to a reduced surface area for its conductive surfaces, which leads to a reduction in the capacitance of the capacitor.

SUMMARY

Embodiments disclosed herein provide semiconductor memory devices and related methods of fabrication.

According to one embodiment, a semiconductor memory device includes a substrate divided into a core area and a peripheral area. A capacitor structure extends over the core and peripheral areas, wherein respective portions of the capacitor structure function as memory cell capacitors in the core area, and as first and second capacitors in the peripheral area, and a combination of the first and second capacitors functions as a first power decoupling capacitor, and a transistor disposed in the peripheral area functions as a second power decoupling capacitor.

According to another embodiment, a semiconductor memory device includes first and second capacitors formed over a transistor in a peripheral area of the substrate, wherein a combination of the first and second capacitors functions as a first power decoupling capacitor, and the transistor functions as a second power decoupling capacitor.

According to another embodiment, a method of fabricating a semiconductor memory device includes; forming an N-well region in a peripheral area of a P-type substrate, forming a P-type transistor in the N-well region, forming a first and second capacitors over the transistor in the peripheral area, connecting a gate of the P-type transistor to a ground voltage and connecting a drain and a source of the P-type transistor to a power supply voltage, such that the P-type transistor functions as a decoupling capacitor for the power supply voltage.

DESCRIPTION OF EMBODIMENTS

Embodiments of the invention will now be described in some additional detail with reference to the accompanying drawings. The invention may, however, be embodied in many different forms and should not be construed as being limited to only the illustrated embodiments. Rather, these embodiments are presented as teaching examples. Throughout the drawings and written description, like reference numbers and labels indicate like or similar elements.

A dynamic random access memory (DRAM) device will be used as an example of the present invention. However, those skilled in the art will readily understand that the advantages and features described in the context of a DRAM example may be extrapolated to other types of memory devices. Thus, the invention is not limited to only DRAM embodiments.

Figure (FIG.) 1 illustrates several different types of power decoupling capacitors. As is well understood in the art, various voltages are applied to the circuits forming a semiconductor memory device. These voltages may rapidly fluctuate due to a number of different factors. Unfortunately, rapid fluctuation of these voltages may result in malfunction of the semiconductor memory device. Therefore, it is necessary to suppress or inhibit rapid fluctuation of the voltages applied to semiconductor memory devices.

Figure 1:
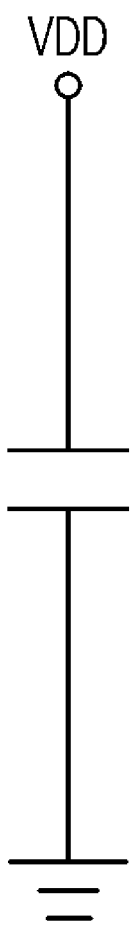
FIG. 1 illustrates different types of power decoupling capacitors.
Figure 1:
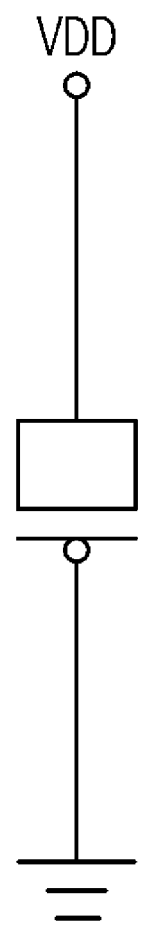
Figure 1:
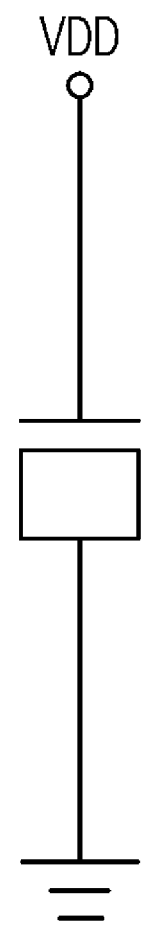

As illustrated in FIG. 1(a), a capacitor may be coupled between a power supply voltage VDD and a ground voltage VSS to reduce power noise. A capacitor used in this manner is called a "power decoupling capacitor." The power decoupling capacitor of FIG. 1(a) is configured to suppress rapid fluctuation of the power supply voltage VDD, since fluctuation in the power supply voltage VDD are notoriously well recognized as leading to malfunctions in a semiconductor memory device.

The power decoupling capacitor shown in FIG. 1(b) is a more specific embodiment of the power decoupling capacitor shown in FIG. 1(a). Here, a PMOS transistor is used as a power decoupling capacitor. The PMOS transistor has a gate connected to a ground VSS and a drain and source connected to the power supply voltage VDD.

The power decoupling capacitor shown in FIG. 1(c) is another more specific embodiment of the power decoupling capacitor shown in FIG. 1(a). As illustrated in FIG. 1(c), an NMOS transistor is used as a power decoupling capacitor. The NMOS has a gate connected to the power supply voltage VDD and a drain and source connected to ground VSS.

Any one of these decoupling capacitors may be used to suppress fluctuations in the power supply voltage VDD. However, adding a power decoupling capacitor to a semiconductor memory device invariably leads to a decrease in the overall integration density of the device, since some an additional area must be provided within the circuit design to accommodate the power decoupling capacitor.

Recognizing this conventional decrease in the integration density of a semiconductor memory device caused by incorporation of a power decoupling capacitor, certain embodiments of the invention provide a transistor in a peripheral circuit area that may be used as a power decoupling capacitor. Those skilled in the art recognize that a "peripheral circuit area" is any substrate area in a semiconductor memory device outside a memory cell array. Overall device integration density is particularly influenced by the level of integration realized in the memory cell array, since the memory cell array contains a very high number of elements. As a result, removing power decoupling capacitors from the memory cell array and placing them in a less densely populated peripheral circuit area markedly increases the overall integration density of the semiconductor memory device.

Figure 2:
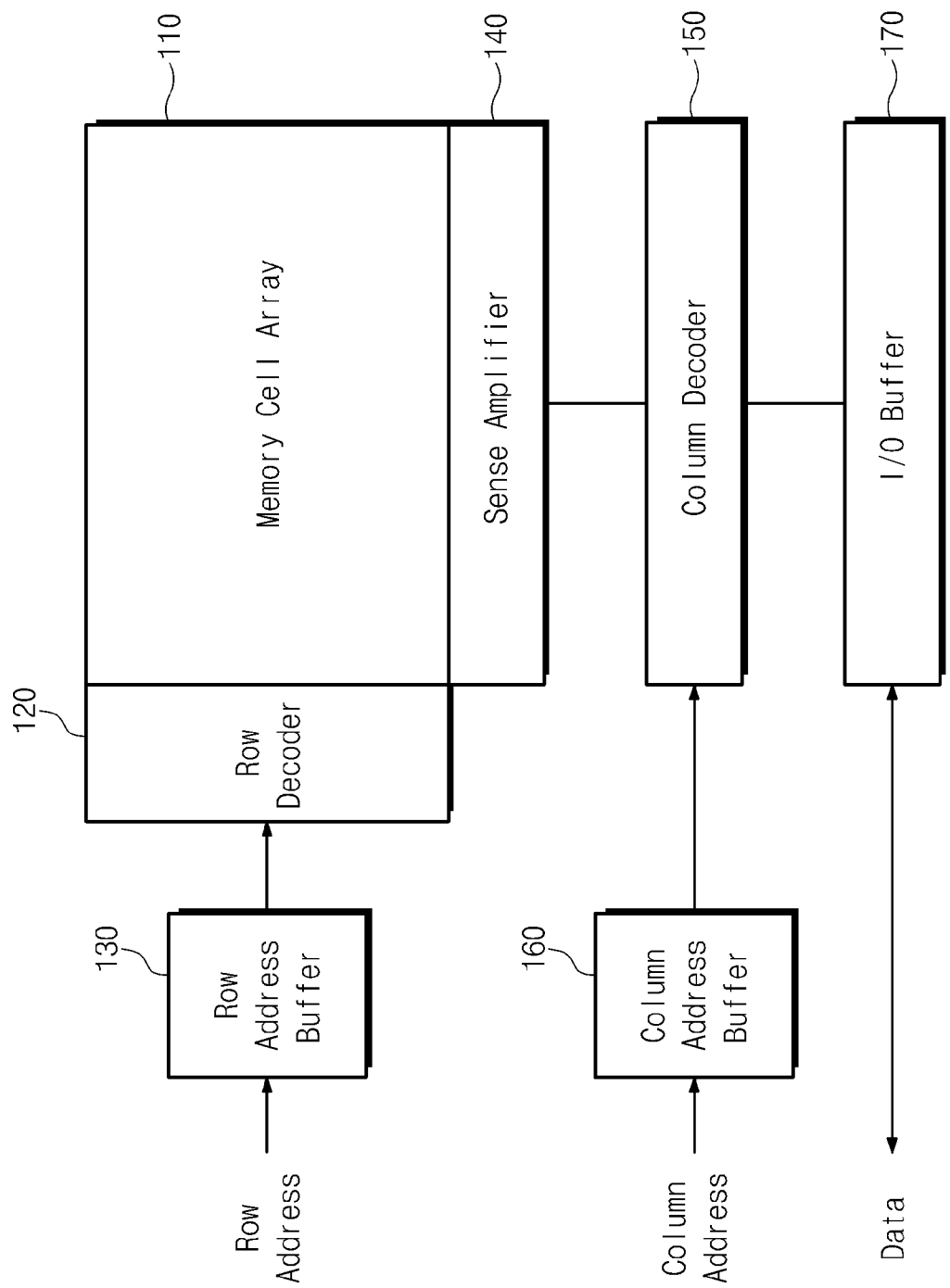
FIG. 2 is a block diagram of a semiconductor memory device according to an embodiment of the invention.

FIG. 2 is a block diagram of a semiconductor memory device according to an embodiment of the invention. The semiconductor memory device generally includes a memory cell array 110, a row decoder 120, a row address buffer 130, a sense amplifier 140, a column decoder 150, a column address buffer 160, and an input/output (I/O) buffer 170.

Although not shown in this figure, the memory cell array 110 includes a plurality of memory cells arranged in a matrix of rows (wordlines) and columns (bitlines). For simplicity of explanation, each of the memory cells in the illustrated example is assumed to be a conventional DRAM memory cell comprising one transistor and one capacitor. However, the invention encompasses other forms of memory cells.

In the illustrated example of FIG. 2, the transistor has a gate connected to a wordline, a drain connected to a bitline, and a source connected to one end (a first side) of the capacitor. The other end (a second side) of the capacitor is connected to ground. The transistor functions as a switch connecting/de-connecting the capacitor to a corresponding bitline. When the transistor is turned ON, the bitline is connected to the capacitor. In this manner, charge representing data may be introduced or removed from the capacitor.

The row address buffer 130 is a circuit configured to temporarily store a row address provided by an external circuit (e.g., a host controller). The row decoder 120 activates at least one of the wordlines traversing the memory cell array 110 in response to a row address signal output from the row address buffer 130.

The column address buffer 160 is a circuit configured to temporarily store a column address provided by the external circuit. The column decoder 150 selects a bitline traversing the memory cell array 110 in response to a column address signal output from the column address buffer 160. The sense amplifier 140 sense and latches data via a selected bitline in the memory cell array 110. The I/O circuit 170 receives data sensed/latched by the sense amplifier 140 and outputs the received data to the outside.

Figure 3:
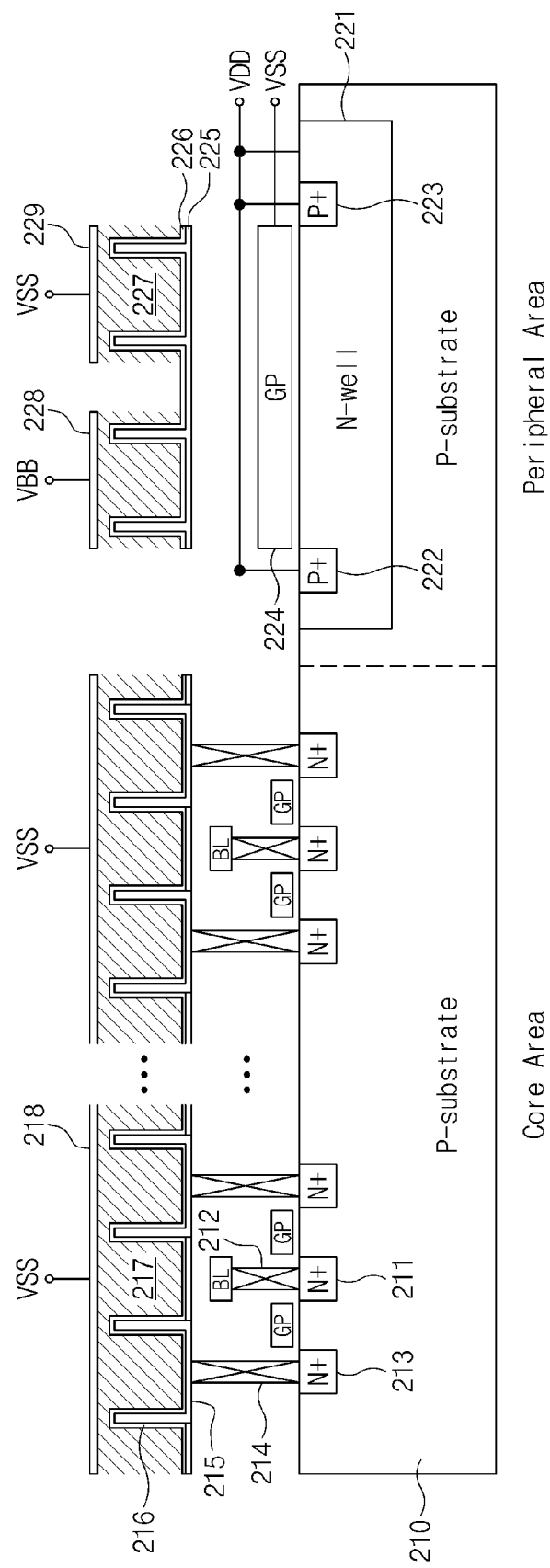
FIG. 3 is a cross-sectional view of the semiconductor memory device shown in FIG. 2.

FIG. 3 is a cross-sectional view of the semiconductor memory device shown in FIG. 2. In an illustrated DRAM device, one memory cell comprises one transistor and one capacitor. These elements are compactly fabricated to increase the integration density of the semiconductor memory device. The dense integration density tends to shorten the transistor gate. The shortened transistor gate enhances certain performance aspects of the device (e.g., increases operating speed).

Unfortunately, the dense integration density also tends to reduce the effective surface area of the conductive surfaces forming the capacitor, thereby reducing capacitance. A minimum capacitance for the capacitor is established (e.g., about 25 pF) to prevent data errors caused by extraneous noise and to facilitate a reasonable refresh interval.

In view of the foregoing, it is clearly essential to maximize, as far as practical, the surface area of the opposing conductive surfaces in each capacitor (i.e., maximizing the "capacitance unit surface area") and/or capacitive effect of the intervening dielectric material. Various approaches have been developed to increase the capacitance unit surface area. One of these approaches forms various three-dimensional capacitor structures. For example, a stacked capacitor structure, a trench capacitor structure, and an irregular structure have been developed and applied to fabrication of DRAM devices. Another approach increases a dielectric constant of the constituent dielectric material.

A capacitor according to an embodiment of the invention has a cylindrical shape that increases its capacitance over similarly sized planar plate capacitors. When a capacitor is fabricated with cylindrical conductive surface areas, the footprint (i.e., the substrate area occupied by the capacitor) may be reduced while yet providing a relatively large capacitance unit surface area. While a cylindrically shaped capacitor offers certain fabrication and performance benefits, the present invention is not limited to the use of only this type of capacitor.

Referring to FIG. 3, the illustrated semiconductor memory device is divided into a core area (i.e., the area containing the memory cell array) and a peripheral area. As noted above, the core area includes the plurality of DRAM memory cells and the peripheral area generally includes other circuits, excepting the memory cell array. In the illustrated embodiment, a transistor in the core area is disposed on a P-type substrate 210. A transistor drain 211 is connected to a bitline BL via a conductive plug 212, and a transistor source 213 is connected to a bottom electrode 215 of a cylindrical capacitor via a conductive plug 212. A dielectric 216 is disposed on the bottom electrode 215 of the capacitor. A conductive material 217 is disposed on the dielectric 216. A top electrode 218 of the capacitor is disposed to apply a ground voltage to the conductive material 217.

In the illustrated embodiment of the invention shown in FIG. 2, a transistor in the peripheral area is formed in an N-well area 221. Since the peripheral circuitry is not generally used to store data, a transistor source 222 is not connected to a bottom electrode 225 of the capacitor and a transistor drain 223 is not connected to a bitline. A bottom electrode 225 of a capacitor is disposed on a transistor gate 224. A dielectric 226 is disposed on the surface of the bottom electrode 225 of the capacitor. A conductive material 227 is disposed on the dielectric 226. A first top electrode 228 of the capacitor is disposed to apply a back bias voltage VBB to the conductive material. A second top electrode 229 of the capacitor is disposed to apply a ground voltage VSS to the conductive material 227.

As set forth above, a capacitor is one type of passive device commonly used in the fabrication of a semiconductor memory device. This is especially true of certain analog circuits typically present in contemporary semiconductor memory devices. In particular, capacitor(s) is(are) used in power supply circuits and other analog circuits commonly appearing in DRAMs, liquid crystal displays (LCD), etc. While the integration density drivers related to circuits in the core area are less critical for circuit in the peripheral area, available substrate surface area in the peripheral area remains a scarce and valuable resource. Accordingly, capacitors having relatively high capacitance are beneficial within peripheral circuits too.

A gate insulator for a transistor should be small, of uniform thickness, and free from defects or impurities. Despite being small and of uniform thickness, the capacitor insulator of the transistor must have a high breakdown voltage. Therefore, the material forming a gate insulator of a transistor is often quite suitable for use as the material forming the insulator of a capacitor. Within integrated circuits including both a capacitor and a transistor (which is common), an MOS capacitance (gate capacitance) formed between an active layer and a gate electrode of the transistor is often used for a capacitor. A capacitor using a MOS capacitance (hereinafter referred to as "MOS capacitor") may use a gate insulator having the above-mentioned superior characteristics as its insulator. The MOS capacitor may be formed at the same time of forming a transistor without additional steps.

However, the MOS capacitor functions as a capacitor only after a channel is formed on an active layer of the MOS capacitor. Therefore, a voltage between a gate electrode and a source area must be controlled according to the conductivity type of the constituent transistor. For example, the voltage applied to the gate of an N-type transistor is higher than a critical voltage, but the voltage applied to the gate of a P-type transistor is lower than the critical voltage.

Returning to FIG. 3, the peripheral area includes a P-type transistor. The P-type transistor has a gate 224 connected to ground VSS. Also the P-type transistor has a drain 222, a source 223, and an N-well area 221 connected to the power supply voltage VDD. For this reason, the P-type transistor in the peripheral area according to an embodiment of the invention may be used as a power decoupling capacitor. Thus, some additional substrate area need not be provided to independently accommodate an additional capacitor functioning as a power decoupling capacitor. This ability increases the overall integration density of the semiconductor memory device.

Figure 4:
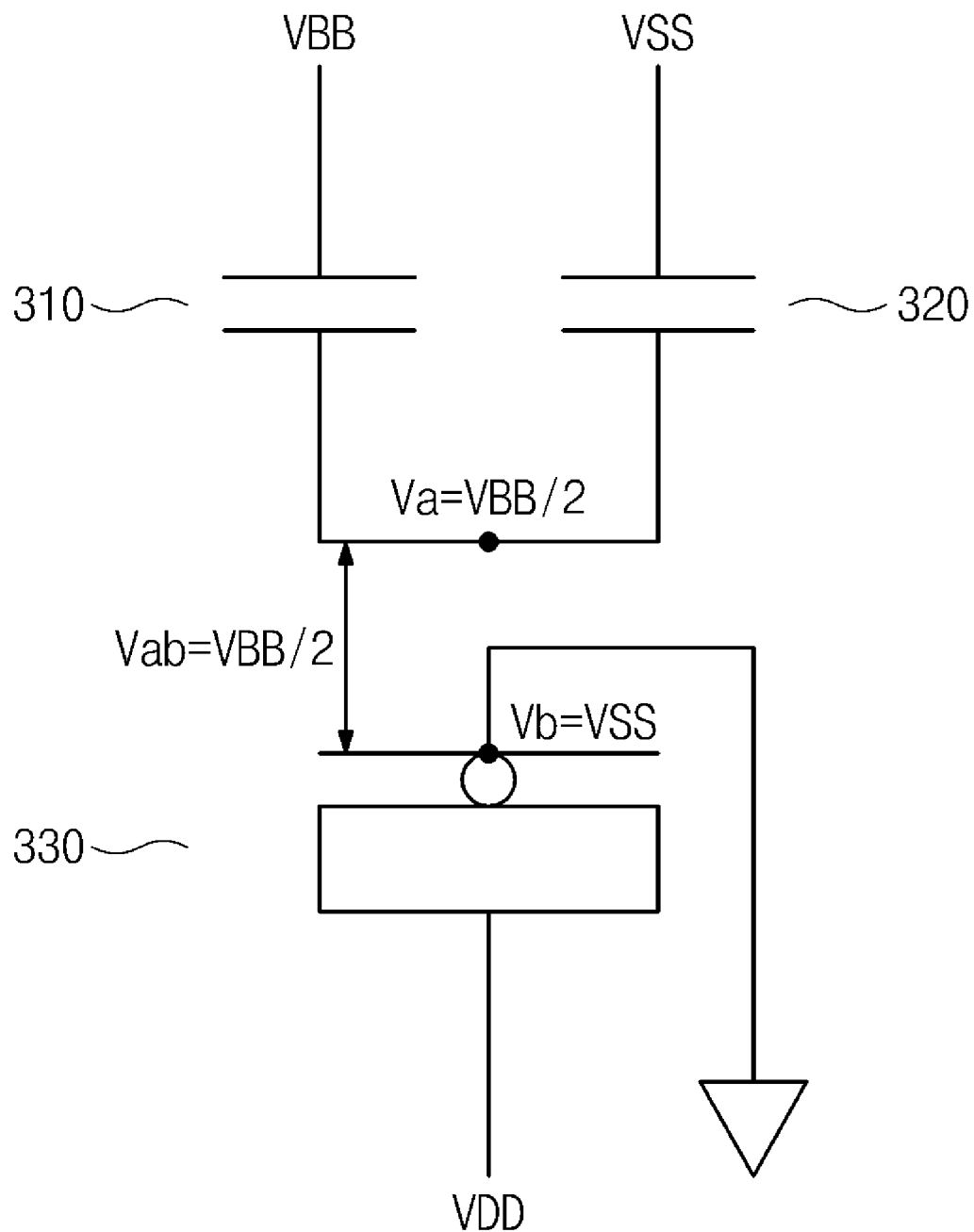
FIG. 4 is an equivalent circuit diagram of a peripheral area shown in FIG. 3.

FIG. 4 is an equivalent circuit diagram of the peripheral area shown in FIG. 3. Referring to FIG. 4, a back bias voltage VBB is applied to one end of a first capacitor 310, and a ground voltage VSS is applied to one end of a second capacitor 320. The back bias voltage VBB is a negative voltage. With recent device trends toward low power consumption for semiconductor memory devices, a back bias voltage VBB lower than ground voltage VSS is applied. The first and second capacitors 310 and 320 function as a power decoupling capacitor suppressing rapid fluctuations of the back bias voltage VBB.

A transistor 330 disposed below the capacitors 310 and 320 is used as a power decoupling capacitor to suppress fluctuations in the power supply voltage VDD. In order to be used as the power decoupling capacitor, the gate of the transistor 330 is connected to a ground VSS and the drain, source, and an N-well area are connected to the power supply voltage VDD.

If a difference between an intermediate node voltage Va common to the first and second capacitors 310 and 320 and a gate voltage Vb for the transistor 330 is higher than the power supply voltage VDD, the transistor 330 may become damaged and thereby degrade the overall reliability of the semiconductor memory device.

In certain embodiments of the invention, ends of the first and second capacitors 310 and 320 are commonly connected. Assuming that the capacitance of the first and second capacitors 310 and 320 are about equal, an intermediate node voltage Va between the first and second capacitors 310 and 320 will be about VBB/2, according to basic charge distribution laws. As noted above, the gate voltage Vb of the transistor 330 is connected to ground voltage VSS. Thus, the difference between the intermediate node voltage Va and the gate voltage Vb of the transistor is VBB/2. Since this voltage difference is less than the power supply voltage (VBB/2<VDD), the reliability of the semiconductor memory device will not be degraded.

In certain embodiments of the invention, the first and second capacitors 310 and 320 function as a power decoupling capacitor suppressing fluctuations in the back bias voltage VBB. Further, the transistor 330 functions as a power decoupling capacitor suppressing fluctuations in the power supply voltage VDD. This is accomplished because the transistor 330 according to the illustrated embodiment of the invention is a P-type transistor. As a result, the integration level of the semiconductor memory device may be increased. By way of comparison, in a conventional semiconductor memory device of similar structure, the drain, source, and gate of an N-type transistor receive a ground voltage. Therefore, the N-type transistor cannot be used as a power decoupling capacitor. This comparative result will be described in some additional detail hereafter.

Figure 5:
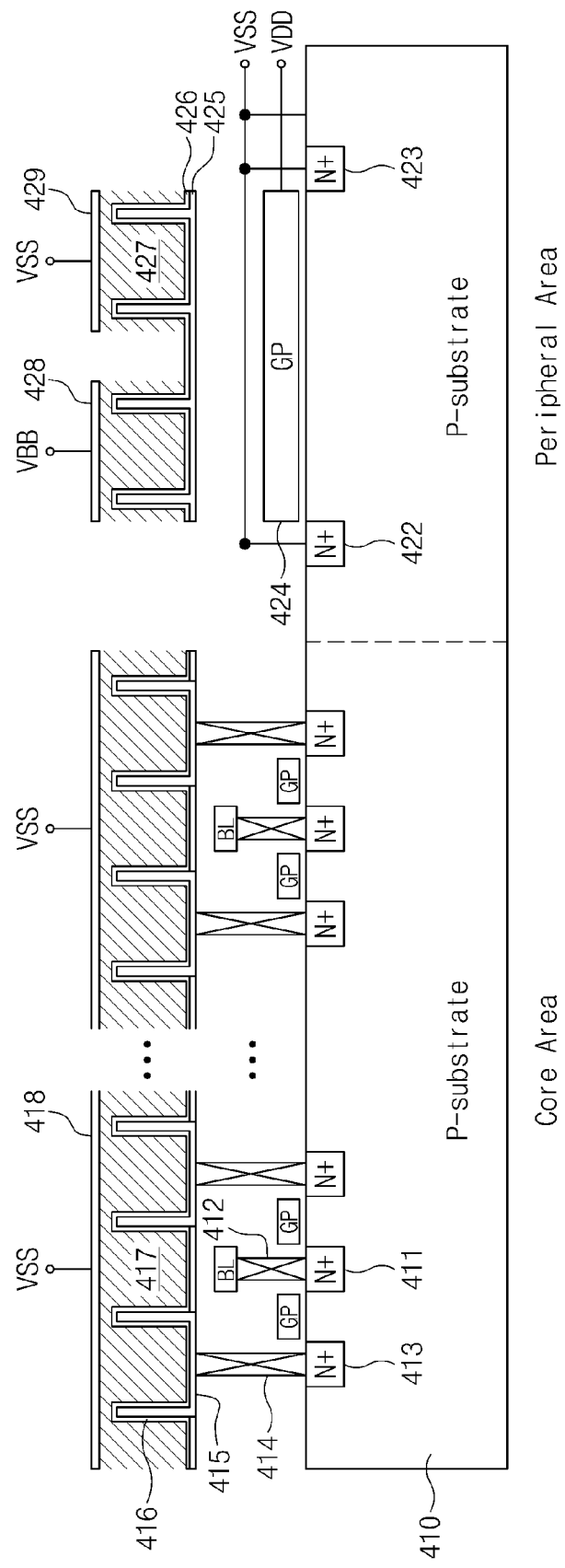
FIG. 5 is a cross-sectional view illustrating disadvantages arising from a transistor used as a power decoupling capacitor.

FIG. 5 is a cross-sectional view illustrating certain potential disadvantages arising from the use of a transistor as a power decoupling capacitor. Referring to FIG. 5, a semiconductor memory device is divided into a core area and a peripheral area. Because the core area shown in FIG. 5 is identical to that shown in FIG. 3, its explanation will be omitted.

A transistor in the peripheral area is disposed on a P-type substrate. Since a peripheral circuit does not store data, a source 423 of the transistor is not connected to a bottom electrode 425 and a drain 422 thereof is not connected to a bitline BL. A bottom electrode 425 of a capacitor is disposed over a gate 424 of the transistor. A dielectric 426 is disposed on a surface of the bottom electrode 425. A conductive material 427 is disposed on the dielectric 426. Top electrodes 428 and 429 are provided to apply a voltage to the conductive material 427.

The transistor in the peripheral area of FIG. 5 is an N-type transistor. Therefore, in order to use the transistor as a power decoupling capacitor, a gate 424 is connected to a power supply voltage VDD and the drain 422, the source 423, and a substrate 410 are supplied with a ground voltage VSS. If a difference between a voltage at the bottom electrode 425 of the capacitor and a voltage at the gate 424 of the transistor is greater than the power supply voltage VDD, degradation of reliability (e.g., breakage of the transistor) may occur. The disadvantages resulting from a voltage difference will now be described below in detail with reference to FIG. 6.

Figure 6:
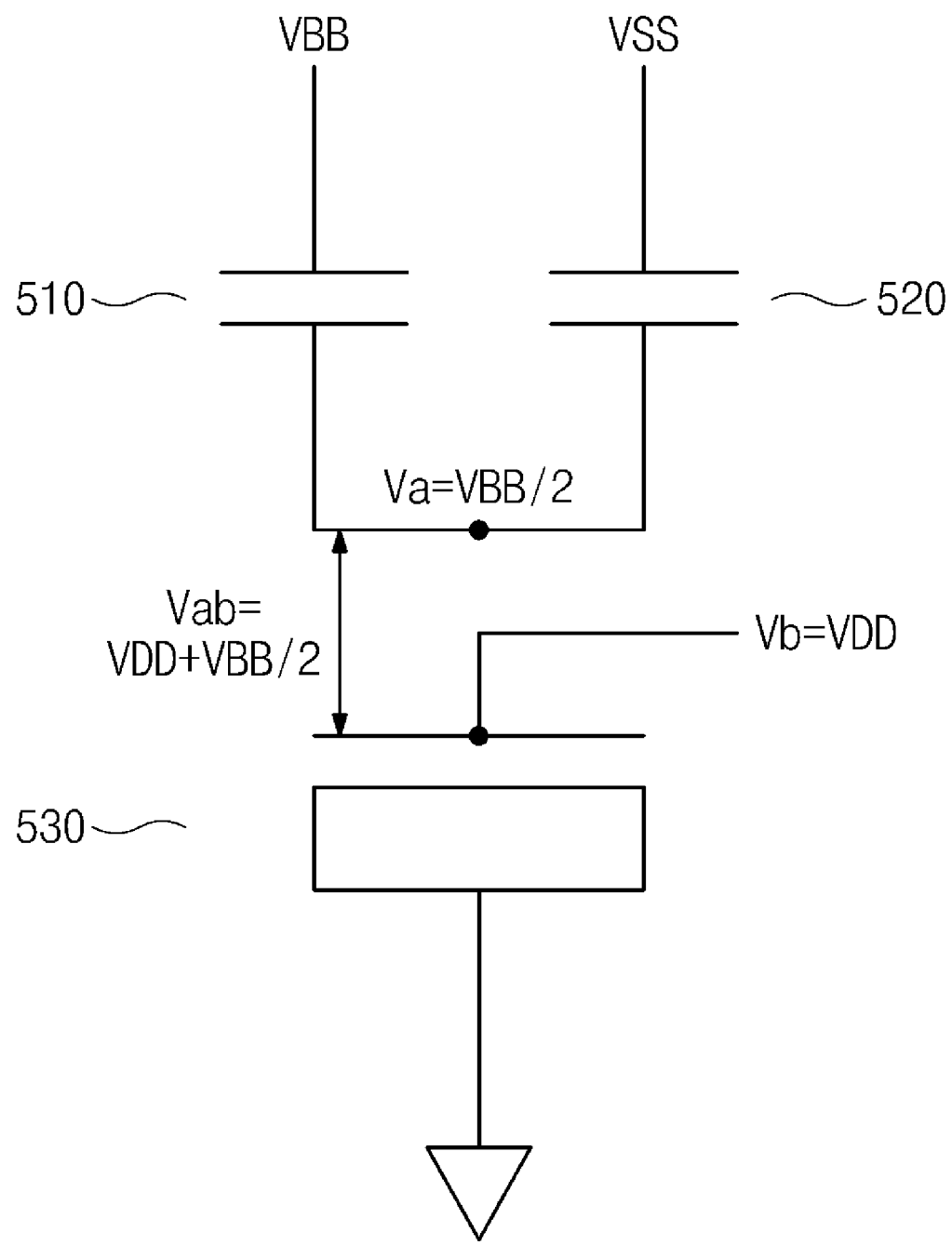
FIG. 6 is an equivalent circuit diagram of a peripheral area shown in FIG. 5.

FIG. 6 is an equivalent circuit diagram of the peripheral area shown in FIG. 5. Referring to FIG. 6, a back bias voltage VBB is applied to one end of a first capacitor 510, and a ground voltage VSS is applied to one end of a second capacitor 520. In this configuration, the first and second capacitors 510 and 520 function as a power decoupling capacitor suppressing fluctuations in the back bias voltage VBB. The power supply voltage VDD is applied to the gate of a transistor 530, and ground voltage VSS is applied to the drain, source, and an N-well area of the transistor 530.

Assuming that capacitance of the first and second capacitors 510 and 520 are about equal, an intermediate node voltage Va common to the first and second capacitors 510 and 520 is VBB/2. Accordingly, a difference between the intermediate node voltage Va and a gate voltage Vb of the transistor 530 is VDD+(VBB/2). Since this voltage difference is greater than the power supply voltage (VDD+(VBB/2)>VDD), degradation of reliability (e.g., breakage of a transistor) may occur. As a result, an N-type transistor 530 in a conventional peripheral area may not be used as a power decoupling capacitor.

Figure 7:
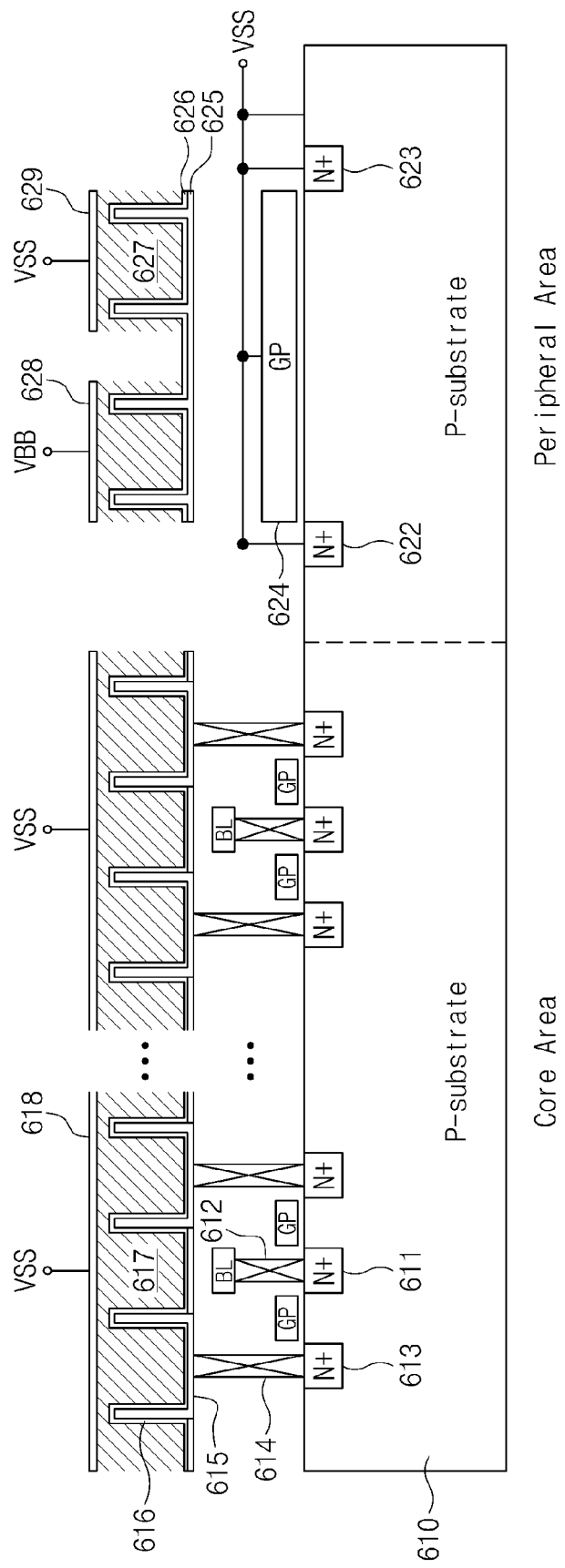
FIG. 7 is a cross-sectional view illustrating bias conditions when a transistor is not used as a power decoupling capacitor.

FIG. 7 is a cross-sectional view further illustrating bias conditions when the peripheral area located transistor is not used as a power decoupling capacitor. Because a core area shown in FIG. 7 is identical to that shown in FIG. 3, its detailed explanation will be omitted. Referring to FIG. 7, ground voltage VSS is applied to a gate 624, a drain 622 and a source 623 of a transistor and a substrate 610 in a peripheral area. For this reason, the transistor cannot be used as a power decoupling capacitor. That is, the first and second capacitors 628 and 629 function as a power decoupling capacitor, but the transistor can not function as a power decoupling capacitor. Accordingly, some additional substrate must be allocated for incorporation of a separate power decoupling capacitor associated with the power supply voltage VDD. This further allocation of substrate surface area decreases the integration density of the semiconductor memory device.

As set forth above in relation to the illustrated embodiments of the invention, a transistor to be used as a power supply voltage decoupling capacitor and located in a peripheral area of a semiconductor memory device is formed on an N-well region of a P-type substrate. Hence, the transistor functioning as a power decoupling capacitor in the peripheral area will be a P-type transistor. Therefore, it is possible to use both a capacitor and a transistor as separate power decoupling capacitors while maintaining a voltage difference between the capacitor and the transistor at a relatively small value.

Figure 8:
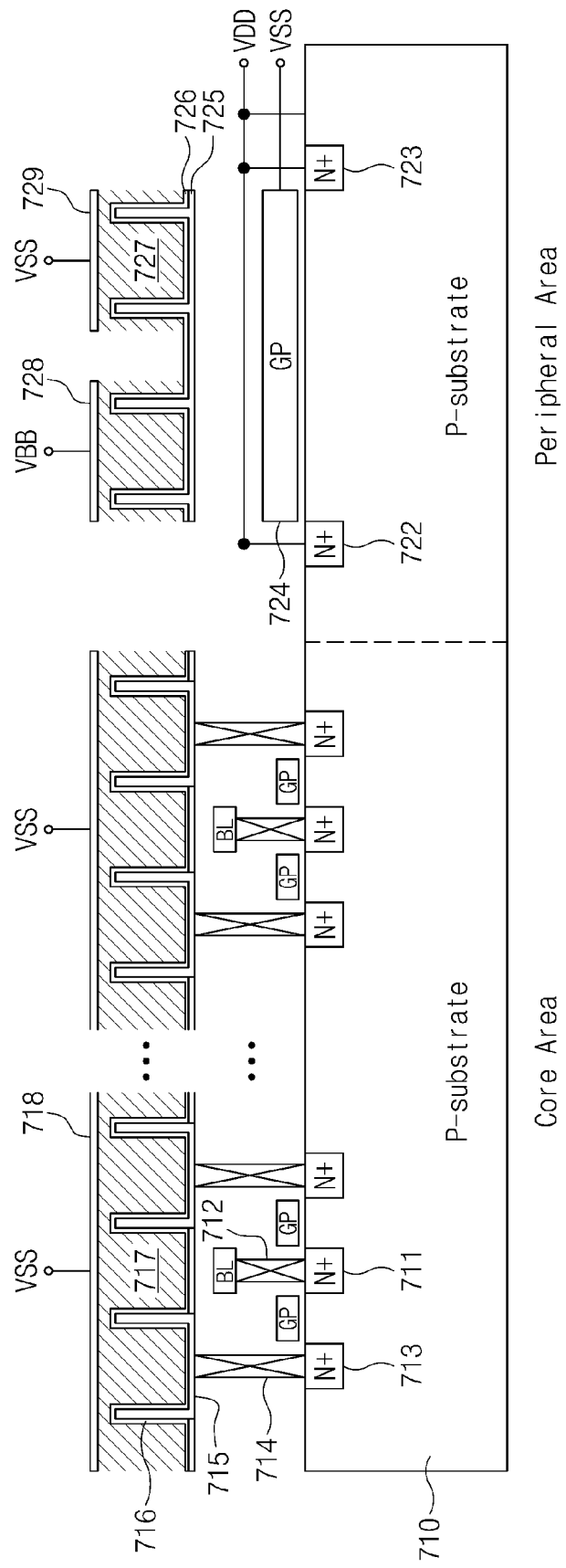
FIG. 8 is a cross-sectional view of a semiconductor memory device according to another embodiment of the invention.

FIG. 8 is a cross-sectional view of a semiconductor memory device according to another embodiment of the invention. Referring to FIG. 8, a semiconductor memory device is again divided into a core area and a peripheral area. Because the core area shown in FIG. 8 is identical to that shown in FIG. 3, its explanation will be omitted.

A transistor in the peripheral area is disposed on a P-type substrate 710. That is, the transistor is an N-type transistor. Since a peripheral circuit does not store data, a source 722 of the transistor is not connected to a bottom electrode 725 of a capacitor and a drain 723 thereof is not connected to a bitline BL. The bottom electrode 725 of the capacitor is disposed over a gate 724 of the transistor. A dielectric 726 is disposed on a surface of the bottom electrode 725. A conductive material 727 is disposed on the dielectric 726. Top electrodes 728 and 729 are provided to apply a voltage to the conductive material 727.

In relation to the embodiment illustrated in FIG. 8, it should be noted that a "capacitor structure" extends over both core and peripheral area of the semiconductor memory device. The capacitor structure in the illustrated embodiment comprises material layers 718/728 and 729, 717/727, 716/726, and 715/725. Thus, the top electrode layer 718 in the core area may be the same material layer forming one or both of top electrodes 728 and 729 in the peripheral area. The conductive material 717 in the core area may be the same material layer forming the conductive layer 727 in the peripheral area, and so on for the other material layers forming the common capacitor structure extending over both core and peripheral areas.

In this manner, the fabrication of the semiconductor device is greatly simplified, since the formation of the first and second capacitors 810 and 820 (see, FIG. 9) occurs during exactly the same fabrication processes that are used to form the memory cells capacitors of the core area.

Figure 9:
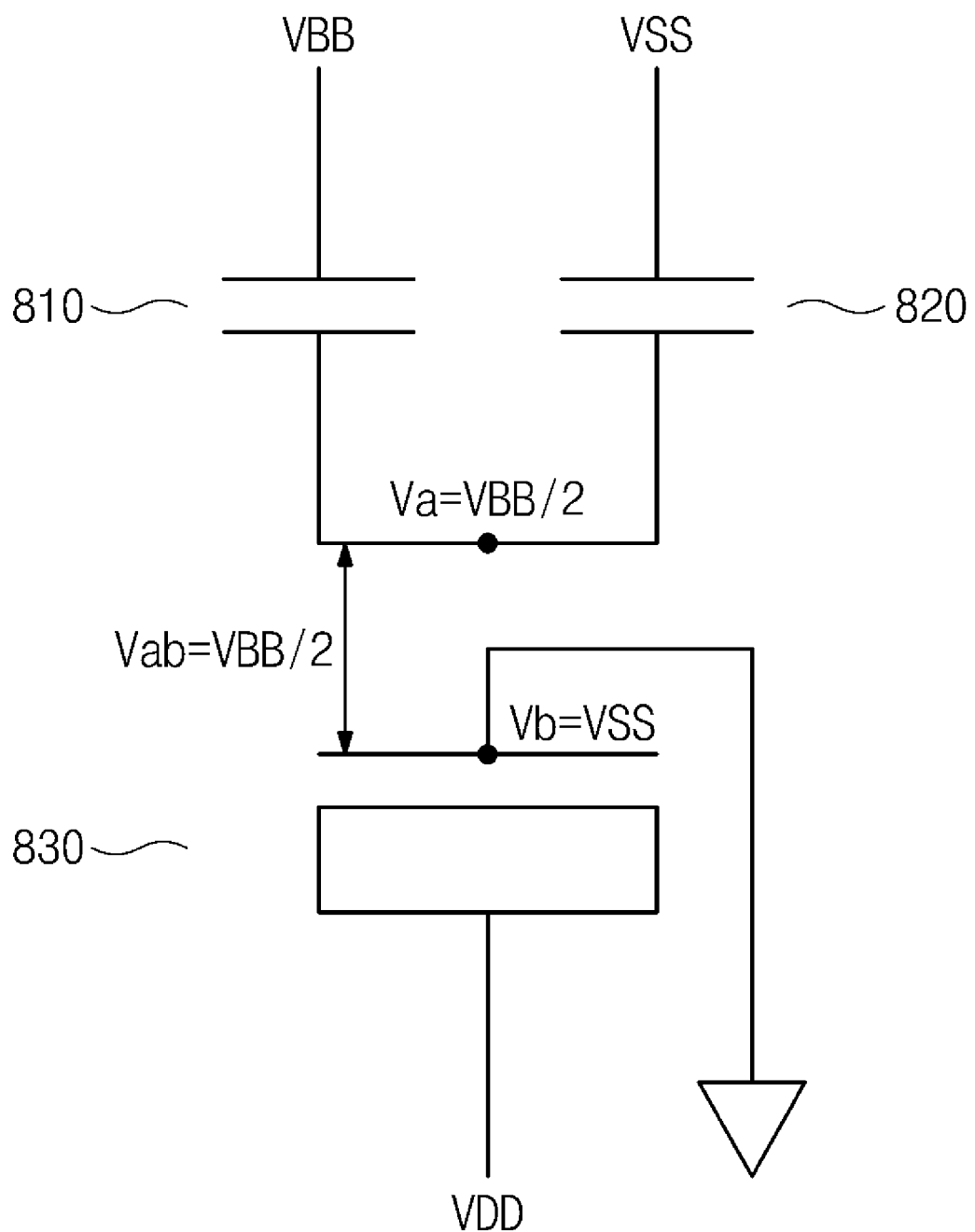
FIG. 9 is an equivalent circuit diagram of a peripheral area shown in FIG. 9.

FIG. 9 is an equivalent circuit diagram of a peripheral area shown in FIG. 9. Referring to FIG. 9, a back bias voltage VBB is applied to one end of a first capacitor 810, and ground voltage VSS is applied to one end of a second capacitor 820. That is, the first and second capacitors 810 and 820 function as a power decoupling capacitor suppressing fluctuations in the back bias voltage VBB. A ground voltage VSS is applied to a gate of a transistor 830, and a power supply voltage VDD is applied to a drain and a source of the transistor 830. Thus, the transistor 830 functions as a power decoupling capacitor suppressing fluctuations in the power supply voltage VDD.

Assuming the capacitances of the first and second capacitors 810 and 820 are about equal, an intermediate node voltage Va common to the first and second capacitors 810 and 820 is VBB/2. As noted above, ground voltage VSS is applied to the gate of the transistor 830. Thus, a difference between the intermediate node voltage Va and a gate voltage Vb of the transistor is VBB/2. Since this voltage difference is less than the power supply voltage (VBB/2<VDD), reliability of the semiconductor memory device is not degraded.

Thus, upper layer (i.e., layers formed on a semiconductor substrate) first and second capacitors 810 and 820 function as a power decoupling capacitor for the back bias voltage VBB, while lower layer transistor 830 functions as a power decoupling capacitor for the power supply voltage VDD. Accordingly, there is no need to allocate additional substrate area for a separate power decoupling capacitor. As a result, integration level and reliability of the semiconductor memory device are enhanced.

Figure 10:
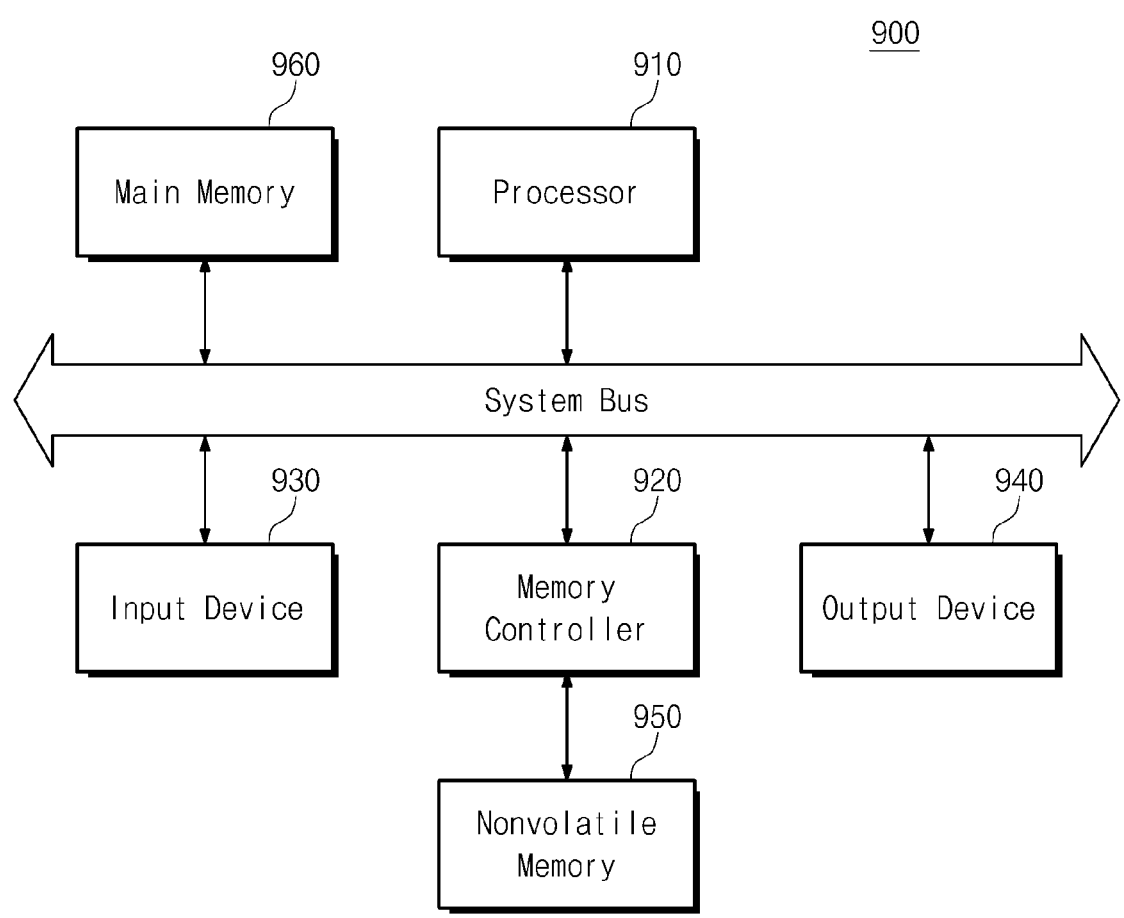
FIG. 10 is a block diagram of a general computational system incorporating a semiconductor memory device according to an embodiment of the invention.

FIG. 10 is a block diagram of a computational system 900 including a semiconductor memory device according to an embodiment of the invention. The computational system 900 generally comprises a processor 910, input devices 930, output devices 940, an auxiliary memory device 950, and a main memory device 960. In this figure, a solid line represents a system bus through which data or commands are transferred.

The computational system 900 receives external data through the input devices 930 such as a keyboard, a camera, etc. The received data may be a user's command or multimedia data such as video data produced by a camera. The received data is stored in the auxiliary memory device 950 or the main memory device 960.

A processing result obtained by the processor 910 is stored in the auxiliary memory device 950 or the main memory device 960. The output devices 940 output the data stored in the auxiliary memory device 950 or the main memory device 960. The data output by the output devices 940 may be human-sensible digital data. For example, the output device 940 includes a display or a speaker. The main memory device 950 may include a dynamic random access memory (DRAM). A capacitor structure according to an embodiment of the invention may be applied to the DRAM. As integration level and reliability of the main memory device 920 are enhanced, thus the computational system 900 may be enhanced accordingly.

Although not shown in the figure, it will be understood by those skilled in the art that a power supply is required to supply power for operation of the computational system 900. In a case where the computational system 900 is a mobile device, a battery is additionally required to supply operating power to the computational system 900.

As explained so far, a semiconductor memory device according to an embodiment of the invention uses peripheral area located transistor as a power decoupling capacitor. Accordingly, there is no need to allocate additional substrate area for a separate power decoupling capacitor. Moreover, the integration density and reliability of the semiconductor memory device are enhanced.

Although the present invention has been described in connection with certain embodiments illustrated in the accompanying drawings, it is not limited thereto. It will be apparent to those skilled in the art that various substitutions, modifications and changes may be made without departing from the scope of the invention as defined by the following claims.

What is claimed is:

1. A semiconductor memory device formed on a substrate divided into a core area and a peripheral area, and comprising:
   a capacitor structure extending over the core and peripheral areas, wherein respective portions of the capacitor structure function as memory cell capacitors in the core area, and as first and second capacitors in the peripheral area; and
   an N-well region formed in the peripheral area,
   wherein a combination of the first and second capacitors functions as a first power decoupling capacitor, a transistor disposed in the peripheral area functions as a second power decoupling capacitor, and the transistor is a P-type transistor formed in the N-well region; and
   wherein the P-type transistor is configured such that a ground voltage is applied to its gate and a power supply voltage is applied to its drain and source, such that the second power decoupling capacitor suppresses fluctuations in the power supply voltage.

2. The semiconductor memory device of claim 1, wherein the first capacitor is configured such that a back bias voltage is applied to a first side of the first capacitor,
   the second capacitor is configured such that a ground voltage is applied to a first side of the second capacitor, and
   respective second sides of the first and second capacitors are coupled at a common voltage node, such that the first power decoupling capacitor suppresses fluctuations in the back bias voltage.

3. The semiconductor memory device of claim 2, wherein a difference between a gate voltage of the P-type transistor and a voltage apparent at the common voltage node is less than the power supply voltage.

4. The semiconductor memory device of claim 1, wherein the first and second capacitors have about the same capacitance.

5. The semiconductor memory device of claim 1, wherein the substrate is P-type and the transistor is an N-type transistor formed in the substrate.

6. The semiconductor memory device of claim 5, wherein the N-type transistor is configured such that a ground voltage is applied to its gate and a power supply voltage is applied to its drain and source, such that the second power decoupling capacitor suppresses fluctuations in the power supply voltage.

7. The semiconductor memory device of claim 6, wherein the first capacitor is configured such that a back bias voltage is applied to a first side of the first capacitor,
   the second capacitor is configured such that a ground voltage is applied to a first side of the second capacitor, and
   respective second sides of the first and second capacitors are coupled at a common voltage node, such that the first power decoupling capacitor suppresses fluctuations in the back bias voltage.

8. The semiconductor memory device of claim 7, wherein a difference between a gate voltage of the N-type transistor and a voltage apparent at the common voltage node is less than the power supply voltage.

9. The semiconductor memory device of claim 5, wherein the first and second capacitors have about the same capacitance.

10. A semiconductor memory device, comprising:
    first and second capacitors formed over a transistor in a peripheral area of the substrate; and
    an N-well region formed in the peripheral area;
    wherein the transistor is a P-type transistor formed in the N-well region;
    wherein a combination of the first and second capacitors functions as a first power decoupling capacitor, and the transistor functions as a second power decoupling capacitor; and
    wherein the P-type transistor is configured such that a ground voltage is applied to its gate and a power supply voltage is applied to its drain and source, such that the second power decoupling capacitor suppresses fluctuations in the power supply voltage.

11. The semiconductor memory device of claim 10, wherein the first capacitor is configured such that a back bias voltage is applied to a first side of the first capacitor,
    the second capacitor is configured such that a ground voltage is applied to a first side of the second capacitor, and
    respective second sides of the first and second capacitors are coupled at a common voltage node, such that the first power decoupling capacitor suppresses fluctuations in the back bias voltage.

12. A method of fabricating a semiconductor memory device, comprising:
    forming an N-well region in a peripheral area of a P-type substrate;
    forming a P-type transistor in the N-well region;
    forming a first and second capacitors over the transistor in the peripheral area;
    connecting a gate of the P-type transistor to a ground voltage and connecting a drain and a source of the P-type transistor to a power supply voltage,
    such that the P-type transistor functions as a decoupling capacitor for the power supply voltage.

13. The method of claim 12, further comprising:
    connecting a first side of the first capacitor to a back bias voltage;
    connecting a first side of the second capacitor to a ground voltage, and
    commonly coupling respective second sides of the first and second capacitors to common voltage node, such that a combination of the first and second capacitors suppress fluctuations in the back bias voltage.

14. The method of claim 13, wherein a difference between a gate voltage of the P-type transistor and a voltage apparent at the common voltage node is less than the power supply voltage.

15. The method of claim 14, wherein the first and second capacitors have about the same capacitance.

* * * * *